(12) United States Patent
Xu et al.

(10) Patent No.: US 11,006,542 B2
(45) Date of Patent: May 11, 2021

(54) POWER-SUPPLY CONNECTOR FOR SHELVES AND POWER-SUPPLY SYSTEM WITH TRACKS FOR USE THEREOF

(71) Applicants: Self Electronics Co., Ltd., Zhejiang (CN); Wanjiong Lin, Zhejiang (CN); Self electronics USA Corporation, Norcross, GA (US)

(72) Inventors: Kai Xu, Zhejiang (CN); Dong Chen, Zhejiang (CN)

(73) Assignee: Self Electronics Co., Ltd., Ningbo (CN)

( * ) Notice: Subject to any disclaimer, the term of this patent is extended or adjusted under 35 U.S.C. 154(b) by 0 days.

(21) Appl. No.: 16/725,645

(22) Filed: Dec. 23, 2019

(65) Prior Publication Data
US 2020/0214165 A1    Jul. 2, 2020

(30) Foreign Application Priority Data
Dec. 27, 2018    (CN) .......................... 201811616563.8

(51) Int. Cl.
*H05K 7/14*     (2006.01)
*G06F 1/18*     (2006.01)
*G06F 1/26*     (2006.01)

(52) U.S. Cl.
CPC ........... *H05K 7/1492* (2013.01); *G06F 1/189* (2013.01); *G06F 1/263* (2013.01)

(58) Field of Classification Search
CPC .. H01R 13/6315; H01R 25/142; A47B 97/00; A47B 21/00; A47B 21/06; A47C 7/72; A47C 7/725; H02J 5/005; H02J 7/025
USPC .......................... 439/246, 121, 122; 362/127
See application file for complete search history.

(56) References Cited

U.S. PATENT DOCUMENTS

| 4,842,536 A * | 6/1989 | Meyrat | H01R 43/16 439/246 |
| 8,887,852 B2 * | 11/2014 | Schaap | B62K 5/02 180/208 |
| 10,184,622 B2 * | 1/2019 | Dong | F21V 33/0012 |

* cited by examiner

*Primary Examiner* — Gary F Paumen
(74) *Attorney, Agent, or Firm* — Wang Law Firm, Inc.

(57) ABSTRACT

The invention relates to a power-supply connector for shelves, comprising a bottom cover, a top cover disposed on the bottom cover, positive and negative power-supply contacts clamped between the bottom cover and the top cover, and a cable with one end extending into a holding cavity formed by the bottom cover and the top cover, wherein the cable is electrically connected with the positive and negative power-supply contacts. According to the invention the positive and negative power-supply contacts are respectively rotatably supported about a pivot center, so that when one of the two free ends of a respective power-supply contact moves in a direction away from the top cover in the corresponding through-hole the other of the two free ends of the respective power-supply contact moves in a direction closer to the top cover.

11 Claims, 4 Drawing Sheets

POWER-SUPPLY CONNECTOR FOR SHELVES AND POWER-SUPPLY SYSTEM WITH TRACKS FOR USE THEREOF

RELATED APPLICATION

This application claims priority to a Chinese Patent Application No. CN 201811616563.8, filed on Dec. 27, 2018.

FIELD OF THE TECHNOLOGY

The invention relates to the field of lighting, in particular to a power-supply connector for shelves and a power-supply system for shelves with tracks configured for connection with at least one such power-supply connector.

BACKGROUND OF THE INVENTION

Shelves are widely used in supermarkets, shopping malls and other places. In order to facilitate the display of goods, it is necessary to provide a lighting on the shelves. In the past, the power-supply of shelves was set on the backlight of shelves. Therefore, LED lamps on the illuminated surface of shelves were connected with the power-supply by threading cables or winding cables from the illuminated surface of the shelves to the backside of the shelves.

This method is prone to result in many problems, such as too many lead cables, disorderly wiring, not conducive to maintenance and aesthetics. Chinese utility model CN 206958710 U, with the title 'A kind of shelf power take-off head and its shelf power take-off system' takes a different approach. The power-supply system for shelves disclosed in this document includes a column, a power-supply strip support frame fixed in the column, two power-supply strips disposed on the power-supply strip support frame, a support arm arranged on the column and a connecting head for electric power-supply of an associated shelf arranged on the support arm. The column comprises a plurality of through-holes. When the free ends of the positive and negative electrical contacts are both inserted into the through-hole, the positive and negative electrical contacts of a connecting head are respectively pushed against two power-supply strips on the power-supply strip support frame to thereby establish an electrical connection between the two power-supply strips and the associated shelf, so as to overcome the above problems.

However, the design accuracy of the connector for power-supply of shelves disclosed in this document needs to be high. Because the connector for power-supply of shelves does not have a device to fix the connector, the connector is likely to be separated from the original conductive position after being inserted and extracted multiple times, so that it cannot reliably conduct electricity for power-supply. In other words, the design of the connector is subject to a limit as regards the number of operations of being inserted and extracted.

BRIEF SUMMARY OF THE INVENTION

In view of the above problems, it is an object of the present invention to provide a power-supply connector for shelves and a power-supply system for shelves with simple structure enabling a reliable power-supply even if the power-supply connector is pulled-off and again connected with the power-supply system many times.

According to the present invention there is provided a power-supply connector for shelves, comprising a bottom cover, a top cover disposed on the bottom cover, positive and negative power-supply contacts clamped between the bottom cover and the top cover, and a cable with one end extending into a holding cavity formed by the bottom cover and the top cover, wherein the cable is electrically connected with the positive and negative power-supply contacts.

The top cover is provided with through-holes arranged spaced apart from each other, and the positive and negative contacts are respectively provided with a first free end and a second free end. The positive and negative power-supply contacts are respectively positioned in the holding cavity with at least one free end of each power-supply contact extending out of the holding cavity via a respective through-hole.

According to the present invention the positive and negative power-supply contacts are respectively rotatably supported about a pivot center, so that when one of the two free ends of a respective power-supply contact moves in a direction away from the top cover in the corresponding through-hole the other of the two free ends of the respective power-supply contact moves in a direction closer to the top cover.

According to a further embodiment, the power-supply connector may further comprise a positive and negative conductive sheet, each associated with a respective one of the positive and negative power-supply contacts. The positive and negative conductive sheet may each be fixed in the holding cavity and each connected with a positive and negative pole of the cable, respectively. The positive and negative power-supply contact may each be connected with an associated positive and negative conductive sheet, respectively, at a respective pivot center respectively formed at the positive and negative conductive sheet.

According to a further embodiment, the positive conductive sheet and the negative conductive sheet may each comprise a protrusion extending transverse to a longitudinal direction of the corresponding through-hole. A middle portions of the positive and negative power-supply contacts provided between the first and second free ends of the positive and negative power-supply contacts is respectively pivotally supported at corresponding protrusions at positions adjacent to the through-holes, for positioning the positive and negative power-supply contacts at the corresponding conductive sheets and electrically connecting the positive and negative power-supply contacts with the corresponding conductive sheets.

According to a further embodiment, one end of the positive and negative conductive sheets respectively may extend transverse to the a longitudinal direction of the corresponding through-hole.

According to a further embodiment, the through-holes respectively may each comprise a first through-hole and a second through-hole spaced apart from each other. The first free end and the second free end of the positive and negative charge contacts is inserted into the corresponding first through-hole and through-second hole, respectively According to a further embodiment, the length of the second through-hole that is disposed close to the cable may be greater than the length of the first through-hole remote from the cable. Furthermore, the width of the middle portions of the positive and negative power-supply contacts that are respectively pivotally supported at corresponding protrusions of the conductive sheets may be less than the width of the second through-holes.

According to a further embodiment, the first and second free ends of the positive and negative power-supply contacts are each of circular shape.

According to a further embodiment, the positive and negative conductive sheets may each comprise a first conductive connecting portion extending in parallel with the longitudinal direction of the first through-hole and second through-hole. Each first conductive connecting portion is preferably bent toward a side of the power-supply to form a respective protrusion of the conductive sheets where the middle portions of the positive and negative power-supply contacts are pivotally supported.

According to a further embodiment, the bottom cover may comprise mounting recesses corresponding to the through-holes, and the mounting recesses may each comprise a third, a fourth and a fifth recess spaced apart from each other. Here, the first free end, the connecting portion and the second free end of the positive and negative power-supply contact is each guided in the third, fourth and fifth recess, respectively.

A further related aspect of the present invention provides a power-supply system for shelves, comprising at least one track, wherein the track is each provided with an upper plate and a lower plate connected with the upper plate, and the lower end surface of the upper plate is provided with a positive and negative conducting bar spaced apart from each other and extending side by side in a longitudinal direction of the track.

According to the present invention the power-supply system for comprises at least one power-supply connector as outlined above, wherein the track and the at least one power-supply connector are matched such that the at least one power-supply connector can be mounted to the track by inserting a front end of the at least one power-supply connector in a space between the upper and lower plate of the track so that the first free end of the positive power-supply contact and the first free end of the negative power-supply contact is respectively in contact with the positive and negative conductive bar, respectively.

According to a further embodiment, the upper end face of the upper plate is provided with a groove formed along the length direction of the track that can be used for coupling with a portion of the power-supply connector by positive-fit, particularly with a hook-shaped protrusion engaging into the groove on the upper end face of the upper plate of the track.

One end of the power-supply connector for shelves close to the cable is provided with an extension arm formed along the direction of the first free end, the distance between the extension arm and the upper end face of the top cover is suitable for the upper plate to be embedded or received in a space formed between the upper and lower plate of the track, and the free end of the extension arm is downward provided with a convex block which can be clamped in the groove formed along the length direction of the track.

Compared with the prior art, the invention has in particular the following advantages that:

a fixed conductive sheet is arranged in the holding cavity of the power-supply connector, and middle portions of the power-supply contacts are pivotally or rotatably supported about a pivot center formed by a respective conductive sheet, e.g. by winding the middle portions of the power-supply contacts around a respective protrusion formed at the conductive sheets. Thus, when one of the two free ends of a respective power-supply contact moves or pivots in a direction away from the top cover in the corresponding through-hole the other of the two free ends of the respective power-supply contact moves or pivots in an opposite direction, namely a direction closer to the top cover.

When the power-supply connector is mounted and connected to a track of a power-supply system, the second free ends of the positive and negative power-supply contacts abut against an outer surface of the upper plate of the track causing the first free end of the positive power-supply contact and the first free end of the negative power-supply contact to be pressed in firm contact with the positive and negative conductive bar, respectively, to thereby establish a reliable electric power-supply.

The improved approach according to the present invention enables that the motion center is well defined and positioned inside the power-supply connector, which helps to avoid the convention unstable position of the power-supply contact caused by the too high and too virtual motion center. The motion center well-defined by the respective conductive sheet helps to reduce the requirements of the design accuracy. At the same time, the number of pulling and inserting actions of the power-supply connector of the present invention is not limited, and the service life of this power-supply connector is improved.

DETAILED DESCRIPTION OF THE INVENTION

Figure 1:
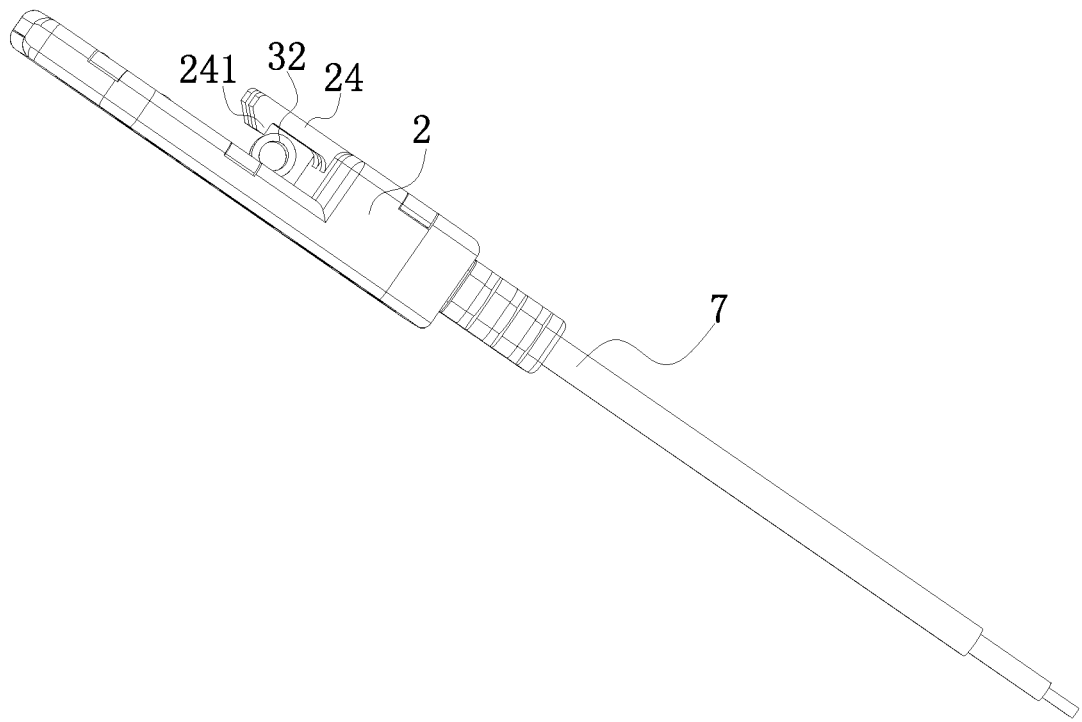
FIG. 1 is a perspective side-view of a power-supply connector for shelves according to the present invention.

Embodiments of the invention will be described in detail below, examples of which are shown in the accompanying drawings, in which the same or similar designation throughout represents the same or similar element or element with the same or similar function. The embodiments described below with reference to the accompanying drawings are exemplary and are only for the interpretation of the invention and cannot be understood as a limitation of the invention.

For introductory explanation, FIGS. 1 to 4 shows an embodiment of a power-supply connector for shelves and the track system for power-supply according to the present application. The power-supply connector for shelves generally comprises a bottom cover 1, a top cover 2 arranged on the bottom cover 1 and in use fixedly connected to the bottom cover 1 to form a connector housing, positive and negative power-supply contacts 3 and 4, which are partially accommodated and clamped between the bottom cover 1 and the top cover 2, and a cable 7 with one end extending into the holding cavity formed by the bottom cover 1 and the top cover 2 and electrically connected with the positive and negative power-supply contacts 3 and 4.

The top cover 2 is provided with positive and negative power-supply through-holes 21 and 22 arranged side by side and spaced apart from each other. The positive and negative power-supply contacts 3 and 4 are respectively provided with a first free end 31 (41) and a second free end 32 (42). The length of the positive and negative power-supply through-holes 21 and 22 are respectively greater than the distance between the corresponding first free end 31 (41) and the second free end 32 (42) of the positive and negative power-supply contacts 3 and 4. The positive and negative power-supply contacts 3 and 4 are respectively located in the holding cavity of the power-supply connector such that at least one end of the positive and negative power-supply contacts 3 and 4 extends out of the holding cavity through the positive and negative power-supply through-hole 21 and 22, respectively. As will be outlined below in more detail, the positive and negative power-supply contacts 3 and 4 are supported inside the holding cavity such that they can rotate or pivot respectively about a positioning position as the pivot center, so that if one of the two opposite ends of the positive and negative power-supply contacts 3 and 4, e.g. the first free end 31 (41), pivots to move in a direction away from the top cover 2 of the power-supply connector, the opposite end of the positive and negative power-supply contacts 3 and 4, e.g. the second free end 32 (42), pivots to move in an opposite direction, namely in the direction towards the top cover 2 of the power-supply connector.

In this embodiment, the power-supply connector for shelves includes positive and negative conductive sheets 5 and 6 corresponding to the positive and negative power-supply contacts 3 and 4 respectively. The positive and negative conductive sheets 5 and 6 are generally C-shaped, fixed in the holding cavity of the power-supply connector, electrically isolated against each other and connected with the positive and negative poles of the cable 7, respectively. The positive and negative power-supply contacts 3 and 4 are respectively electrically connected with the positive and negative conductive sheets 5 and 6 and rotatably supported at the front legs 51 (61) of the positive and negative conductive sheets 5 and 6, so that they can rotate with the connection location as the pivot center. More specifically, if the first free end 31 (41) of the positive (negative) power-supply contact 3 (4) pivots to move in a direction away from the top cover 2 in the corresponding hole 21 (22), the second free end 32 (42) of the positive (negative) power-supply contact 3 (4) will be forced to pivot in an opposite direction, i.e. to move in a direction closer to the top cover 2 in the corresponding hole.

The first free end 31 (41) and the second free end 32 (42) of the positive and negative power-supply contacts 3 and 4 respectively extends towards the top cover 2 direction and extend partially through the corresponding power-supply through-holes 21 (22) of the top cover 2 to facilitate mechanical contact and electrical connection with the conductive bar in the power supply track of the shelf system. The specific structure and function will detail later.

The conductive sheets 5, 6 are located inside the holding cavity of the power-supply connector, and each power-supply contact 3, 4 is connected with one of the conductive sheets 5, 6 and can rotate about the connection portion between the two members. In this way, the pivot center of the respective power-supply contact 3, 4 is limited in the power take-off plug and the pivot center is precisely defined by the conductive sheet 5, 6. In other words, the pivot center can be positioned and structured through visual or quantitative methods such as structural adjustment or position change, which can effectively reduce the problems of power-supply connectors according to the prior art, where the virtual movement of the power-supply contacts made it difficult to design the contact with high precision. The configuration of the power-supply connector according to the invention makes a mass production possible and greatly improves the production efficiency. It also benefits from the design that the pivot center is materialized by positioning the electric contact by means of the conductive sheet. Because each power-supply contact 3, 4 is rotatably supported according to the seesaw principle, the power-supply connector according to the present invention can be pulled and inserted to conduct electricity well, and the electric contact can be prevented from deviating from its original position after being pulled and inserted many times, which effects the electric conduction effect, improves the service life of the power-supply connector for shelves, and reduces the cost.

The positive conductive sheet 5 and the negative conductive sheet 6 is each arranged across the corresponding positive and negative through-hole 21 and 22, and the positive and negative power-supply contact 3 and 4 is each connected with and positioned by a pin-like protrusion 54, 64 of the positive and negative conductive sheet 5, 6, which pin-like protrusion 54, 64 extends transverse to the corresponding positive and negative through-hole 21, 22 and is disposed directly above the corresponding positive and negative through-hole 21, 22 of the positive and negative conductive sheet 5, 6. In this embodiment, one end 51, 61 of the positive and negative conductive sheet 5, 6 each extends transverse to the corresponding positive and negative through-hole 21, 22.

Figure 3:
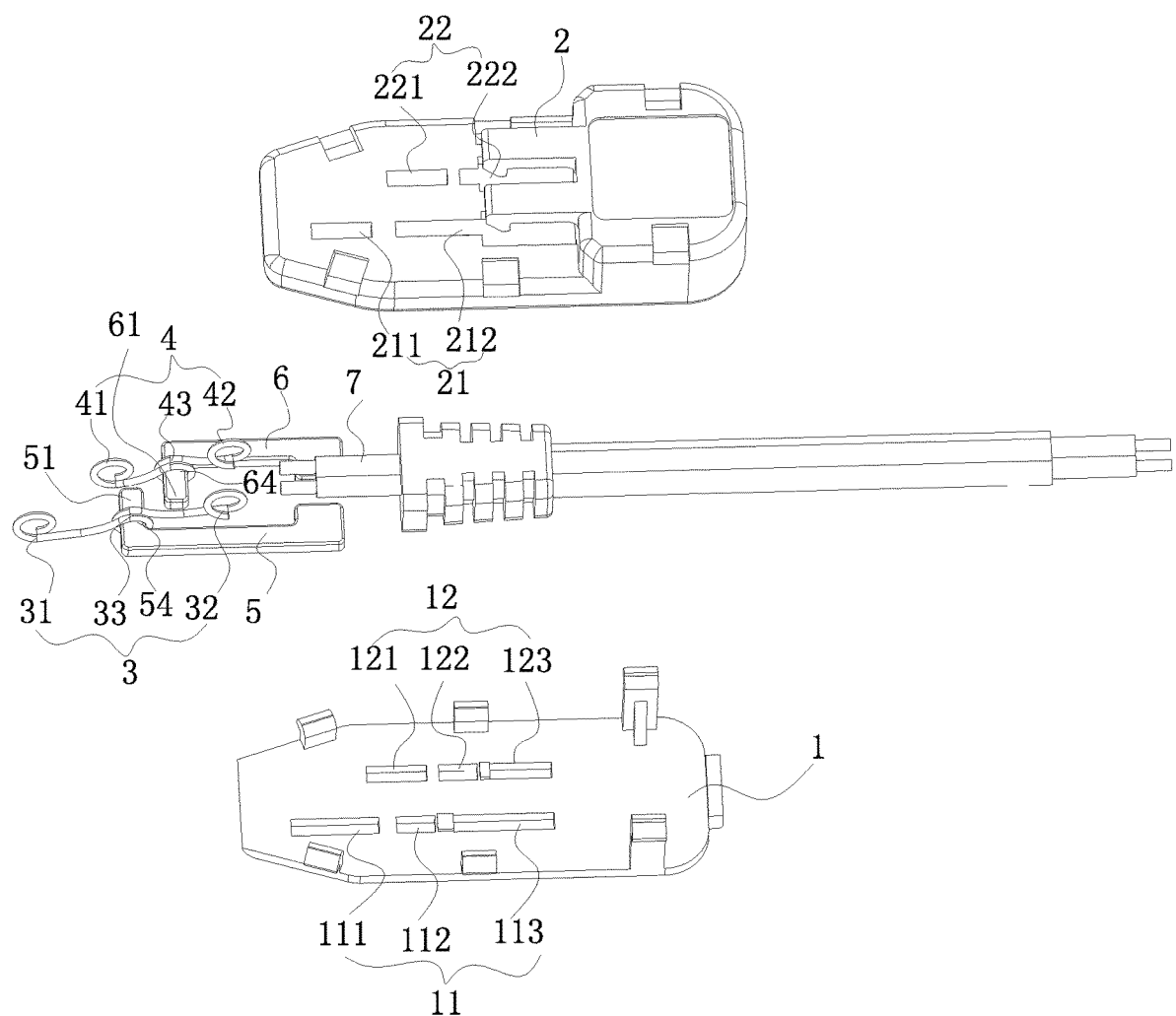
FIG. 3 is an exploded view of the power-supply connector for shelves according to the present invention of FIG. 1.

As shown in FIG. 3, the positive through-holes 21 include a first through-hole 211 and a second through-hole 212 spaced apart from each other, and the negative through-holes 22 include a first through-hole 221 and a second through-hole 222 spaced apart from each other. The positive and negative power-supply contacts 3 and 4 are associated to the positive and negative through-holes 21 and 22 one by one, and extend in parallel to the positive and negative through-holes 21 and 22. The first free end 31 (or 41) and the second free end 32 (or 42) of the positive (negative) power supply contact 3 (4) extends towards the top cover 2 and is inserted into the corresponding first and second through-hole 211, 212 (221, 222), respectively.

The length of the second through-holes 212 and 222 that are close to the cable 7 is longer than the length of the first through-holes 211 and 221 that farther away from the cable 7. One end 51 (61) of the positive (negative) conductive sheet 5 (6) extends transverse to the longitudinal direction of the second through-hole 212 (222) of the corresponding positive (negative) through-hole 21 (22), that is, the first through-hole 211 and the second through-hole 212 (or the first through-hole 221 and the second through-hole 222) are aligned. The middle portion 33 (43) between the first and the second free ends 31, 32 (41, 42) of the positive (negative) power-supply contact 3 (4) is connected to and positioned on the associated transverse pin-like portion 54 (64) provided on the positive (negative) conductive sheet 5 (6) and is positioned directly above the positive (negative) power-supply through-hole 21 (22), and can rotate about the associated transverse pin-like portion 54 (64) as a pivot center while being electrically connected with the associated positive (negative) conductive sheet 5 (6). In the embodiment of FIG. 3 the middle portion 33 (43) of the positive (negative) power-supply contact 3 (4) is wound around the transverse pin-like portion 54 (64) and the width of the middle portion 33 (43) is larger than the width of the second through-hole 212 (222) so that it cannot project through the second through-hole 212 (222) but is retained inside the holding cavity of the connector.

Because of the design of the through-holes as outlined above, wherein the width of the middle portions 33, 43 of the power-supply contacts 3, 4, which are each wound around a corresponding pin-like portion 54, 64 of the conductive sheets 5, 6 to establish the electric contact around with the corresponding conductive sheet 5, 6, is less than the width of the corresponding through-holes 21, 22, the middle portions 33, 43 can easily move in the corresponding through-holes 21, 22. Meanwhile, the through-holes 21, 22 each comprise a first through-hole and a second through-hole that are spaced apart from each other. When the first free ends 31, 41 of the power-supply contacts 3, 4 that are inserted into and guided by the first through-holes 211, 221 move in the direction towards the top cover 2, the space between the first through-holes 211, 221 and the second through-holes 212, 222 can delimit the movement of the power-supply contacts 3, 4 and particularly can prevent excessive movement of the power-supply contacts 3, 4 to thereby ensure a good conductivity.

In this application, the second free ends 32 and 42 of the positive and negative power-supply contacts 3, 4, i.e. the ends close to the cable 7, extend through the corresponding through-hole 212 and 222, respectively. The specific working principle of the electric contact achieved by the of the positive and negative power-supply contacts 3, 4 will be described later. At the same time, it needs to be mentioned that the positive and negative power-supply contacts 3, 4 have a certain elasticity, which is known by those skilled in the art. It is not detailed here.

As a preferred choice, both free ends 31, 32 and 41, 42 of the positive and negative power-supply contacts 3 and 4 are wound to a circular structure, as shown in FIG. 3, but may, of course, also have other shapes, such as triangles, as long as they do not hinder the movement and insertion of the connector into a track system. However, a circular shape is convenient for processing and forming, and when the power-supply contact is inserted into a track, seesaw movement of the positive and negative power-supply contacts 3 and 4 about the respective pivot center occurs, which will now be described with reference to the track assembly.

Figure 4:
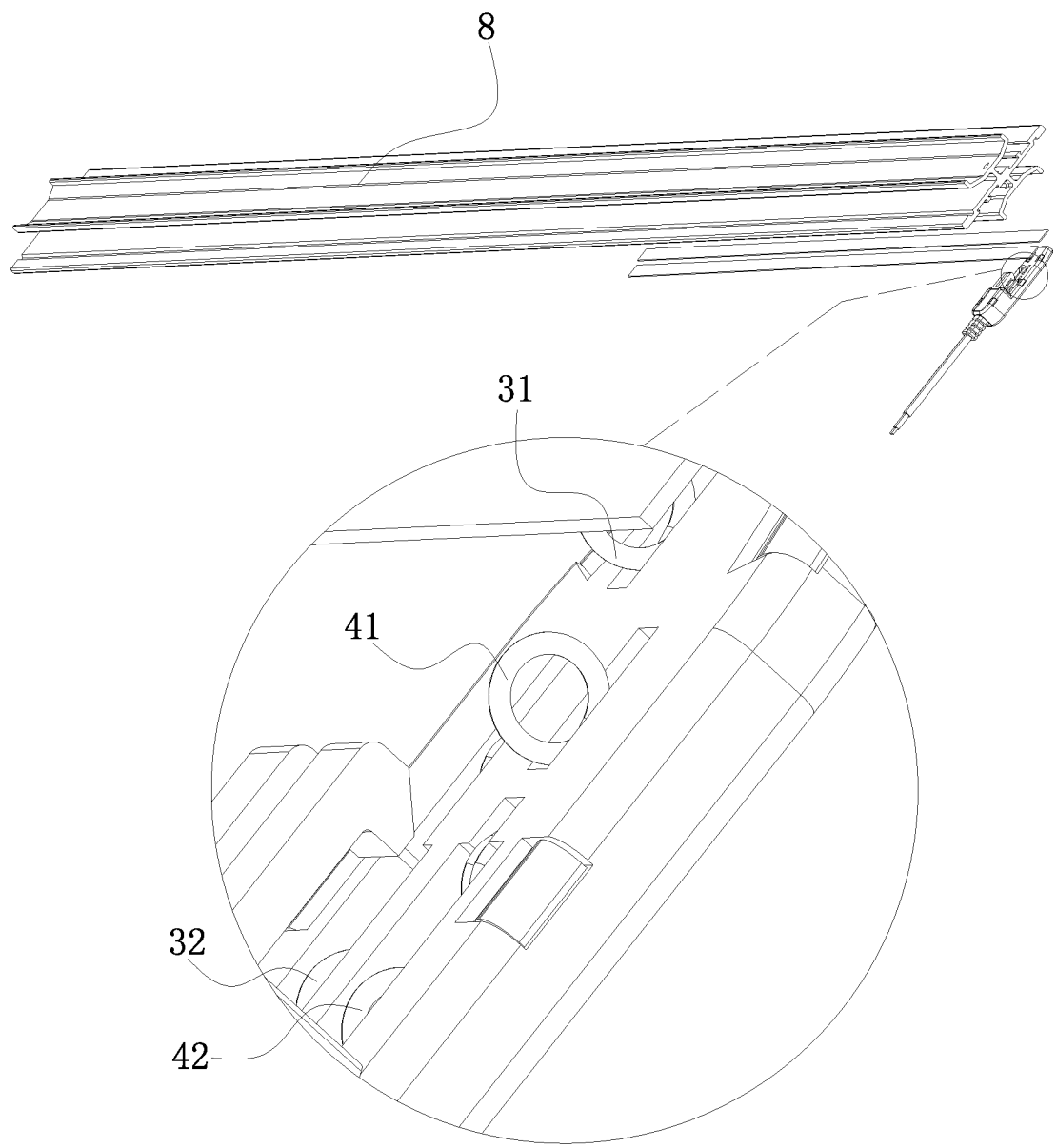
FIG. 4 is a partially exploded view of FIG. 2.

Referring to FIG. 4, the positive and negative conductive sheets 5 and 6 each comprise a first conductive sheet portion extending generally in the longitudinal direction of the first and second through-hole 211, 221 and 212, 222, respectively, and a second pin-like conductive sheet portion 51 and 61, respectively, that extends transverse to the respective first conductive sheet portion and forms an end 51 (or 61) of the positive and negative conductive sheet 5 and 6.

Referring to FIGS. 3 and 4, in order to ensure a convenient movement of the power-supply contacts 3 and 4, as a further improvement of the present invention, the bottom cover 1 may include positive and negative mounting recesses 11 and 12 corresponding to the positive and negative power-supply through-holes 21 and 22. The positive and negative mounting recesses 11 and 12 are respectively composed of third, fourth and fifth recesses 111, 112, 113 and of the third, fourth and fifth recesses 121, 122, 123, respectively, that are each arranged spaced apart to each other and preferably are not formed as through-holes of the bottom cover 1. The first free ends 31, 41, the middle portions 33, 43 and the second free ends 32, 42 of the positive and negative power-supply contacts 3, 4 can be correspondingly contained and guided in the third, fourth and fifth recesses 111, 112, 113 (or 121, 122, 123), so as to further ensure the movement convenience of the electric contact.

Figure 2:
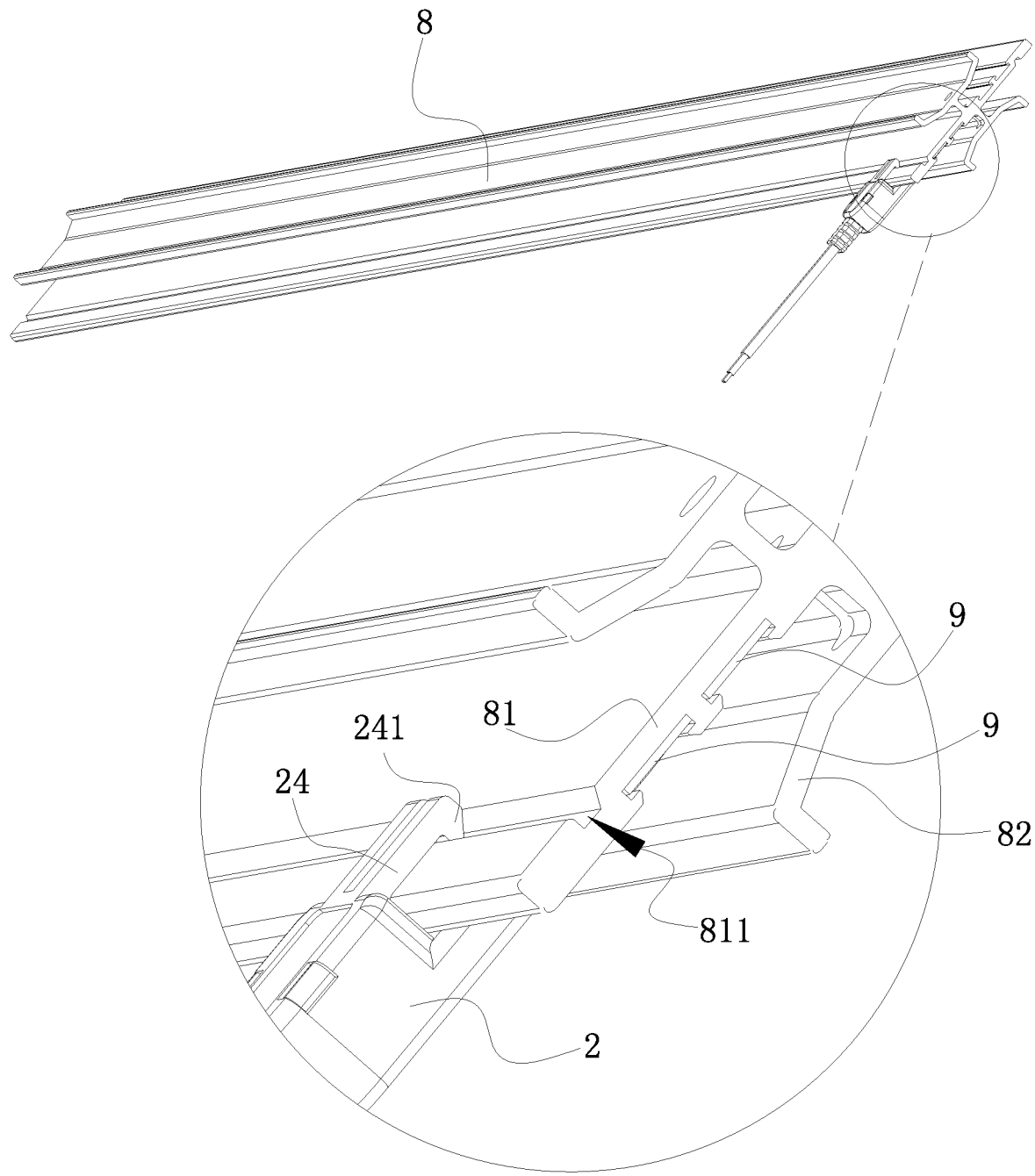
FIG. 2 is the structural diagram showing the power-supply connector for shelves according to the present invention when connected to a power-supply track system.

Referring to FIG. 2, a shelf power-supply system with tracks for shelves according to the present invention will be described in the following. The power-supply system includes at least one track 8 each having an upper plate 81 and a lower plate 82 connected with the upper plate 81. The lower end surface of the upper plate 81 is provided with a positive and negative conductive bar 9 that is each accommodated and fixed in a corresponding T-shaped groove provided on the front surface of the upper plate 81. The conductive bars 9 are spaced apart and electrically isolated from each other, arranged side by side and each extend along the longitudinal direction of the track 8. The front end of the power-supply connector for shelves remote from the cable 7 is embedded or received in the space between the upper and lower plates 81, 82, whereas the free end of the extension arm 24 with its hook-shaped protrusion 241 positively engages into a groove 811 provided on the outer side of upper plate 81, to thereby fix the position of the power-supply connector at the track 8. In the connecting position shown in FIG. 2, the first free end 31 of the positive power-supply contact and the first free end 41 of the negative power-supply contact is each in contact with a respective one of the positive and negative conducting bars 9. On the other hand, the second free end 32 of the positive power-supply contact 3 and the second free end 42 of the negative power-supply contact 4 that project into the space between the two arms of the power-supply connector in the relaxed home position (cf. FIG. 1) abut against the lower end face of the upper plate 81 and thus pushed via the through holes 212, 222 provided in the top cover 2 (cf. FIG. 2) into the holding cavity of the power-supply connector, which causes that the first free end 31 of the positive power-supply contact and the first free end 41 of the negative power-supply contact pivots in opposite direction about the pivot center, so that the first free end 31 of the positive power-supply contact and the first free end 41 of the negative power-supply contact is each firmly pressed in contact with the respective one of the positive and negative conducting bars 9 for electrical connection.

Referring to FIGS. 1-4, when the power-supply connector is to be connected and assembled with the track 8, the front end of the power-supply connector remote from the cable 7 first contacts the lower end face of the upper plate 81, that is, the first free end 31 of the positive power-supply contact and the first free end 41 of the negative power-supply contact each extends into the space between the upper and lower plates 81, 82 of the track. When the power-supply connector is further moved toward the track, the second free end 32 and 42 of the positive and negative power-supply contacts 3, 4, which project into the space between the two arms of the power-supply connector in the relaxed home position (cf. FIG. 1) and extend out of the second through-holes 212 and 222 of the top cover 2, will then get in contact with the outer surface of the upper plate 81 of the track, which will push the second free ends 32, 42 of the positive and negative power-supply contacts 3, 4 via the second through-holes 212 and 222 of the top cover 2 further into the holding cavity of the power-supply connector. This movement of the second free ends 32, 42 of the positive and negative power-supply contacts 3, 4 causes the first free ends 31, 41 of the positive and negative power-supply contacts 3, 4 to move in the direction towards the top cover 2, because the positive and negative power-supply contacts 3, 4 are pivotally supported at the pin-like transverse bars 51, 61 of the positive and negative conductive sheets 5, 6 as pivot centers.

When the power-supply connector is further moved toward the track, finally, the hook-shaped protrusion 241 positively engages into groove 811 on the outer surface of the upper plate 81 so that the power-supply connector is finally fixed at the track 8 and the longer extension arm of the power-supply connector is received in the space between the upper and lower plate 81, 82 of the track 8. Due to the pivotal support of the positive and negative power-supply contacts 3, 4 and abutment of the second free end 32 and 42 of the positive and negative power-supply contacts 3, 4 against the outer surface of the upper plate 81 of the track, the first free ends 31, 41 of the positive and negative power-supply contacts 3, 4 are firmly pressed against the conductive bars 9 provided in the grooves of the upper plate 81. The first free ends 31, 41 of the positive and negative power-supply contacts 3, 4 are thus in electrical contact with a respective one of the conductive bars 9. The current flows via the positive and negative power-supply contacts 3, 4, the connecting portions 51, 61, the conductive sheets 5, 6 to respective contact end of the cable 7, to provide electric power for lamps connected with the other end of the cable 7. Thus, the first free ends 31 and 41 of the positive and negative power-supply contacts 3, 4 take power from the conductive bars 9, to energize lamps, particularly LED-lamps, provided e.g. at a shelf.

In order to further fix the power-supply connector at a track, the upper end face (outer face) of the upper plate 81 is provided with a groove 811 extending in the longitudinal direction of the track 8, and the end of the power-supply connector near the cable 7 is provided with an extension arm 24. The distance between the extension arm 24 and the upper end face of the top cover 2 is matched to the distance between the inner and outer surface of the upper plate 81 of the track so that the power-supply connector can be clamped onto the upper plate 81, as shown in FIG. 2, with the longer extension arm of the power-supply connector being received in the space between the upper and lower plate 81, 82 of the track and with the shorter extension arm 24 and the hook-shaped block 241 embracing the front edge of the upper plate 81 and the hook-shaped block 241 being positively fixed in the groove 811 on the outer face of the upper plate 81.

It should be noted that the shelf power-supply system also includes other components, but since this is not the focus of the application, it is not detailed here.

In addition to the above improvements, other similar improvements are also included in the improvement scope of the invention, and will not be described here. Although embodiments of the present invention have been shown and described, it will be understood by those skilled in the art that various changes, modifications, substitutions and deformations can be made to these embodiments without departing from the principles and purposes of the present invention.

The above disclosure has been described by way of example and in terms of exemplary embodiment, and it is to be understood that the disclosure is not limited thereto. Rather, any modifications, equivalent alternatives or improvement etc. within the spirit of the invention are encompassed within the scope of the invention as set forth in the appended claims.

What is claimed is:

1. A power-supply connector for shelves, comprising
a bottom cover,
a top cover disposed on the bottom cover,
positive and negative power-supply contacts clamped between the bottom cover and the top cover, and
a cable with one end extending into a holding cavity formed by the bottom cover and the top cover, the cable being electrically connected with the positive and negative power-supply contacts; wherein
the top cover is provided with through-holes arranged spaced apart from each other, and
the positive and negative contacts are respectively provided with a first free end and a second free end, wherein
the positive and negative power-supply contacts are respectively positioned in the holding cavity with at least one free end of each power-supply contact extending out of the holding cavity via a respective through-hole, wherein
the positive and negative power-supply contacts are respectively rotatably supported about a pivot center, so that when one of the two free ends of a respective power-supply contact moves in a direction away from the top cover in the corresponding through-hole the other of the two free ends of the respective power-supply contact moves in a direction closer to the top cover,
wherein, the power-supply connector for shelves further comprising a positive and negative conductive sheet, each associated with a respective one of the positive and negative power-supply contacts, wherein
the positive and negative conductive sheet is each fixed in the holding cavity and each connected with a positive and negative pole of the cable, respectively, and
the positive and negative power-supply contact is each connected with an associated positive and negative conductive sheet, respectively, at a respective pivot center respectively formed at the positive and negative conductive sheet.

2. The power-supply connector for shelves as claimed in claim 1, wherein the positive conductive sheet and the negative conductive sheet each comprises a protrusion extending transverse to a longitudinal direction of the corresponding through-hole, wherein
middle portions of the positive and negative power-supply contacts provided between the first and second free ends of the positive and negative power-supply contacts are respectively pivotally supported at corresponding protrusions at positions adjacent to the through-holes, for positioning the positive and negative power-supply contacts at the corresponding conductive sheets and electrically connecting the positive and negative power-supply contacts with the corresponding conductive sheets.

3. The power-supply connector for shelves as claimed in claim 2, wherein one end of the positive and negative conductive sheets respectively extends transverse to a longitudinal direction of the corresponding through-hole.

4. The power-supply connector for shelves as claimed in claim 2, wherein the first free end and the second free end of the positive and negative power-supply contacts each extends towards the top cover and is cacti each is inserted into a corresponding one of the through-holes formed in the top cover.

5. The power-supply connector for shelves as claimed in claim 2, wherein the through-holes respectively comprises a first through-hole and a second through-hole spaced apart from each other, wherein the first free end and the second free end of the positive and negative charge contacts is inserted into the corresponding first through-hole and through-second hole, respectively.

6. The power-supply connector for shelves as claimed in claim 5, wherein the length of the second through-hole that is disposed close to the cable is greater than the length of the first through-hole remote from the cable, wherein the width of the middle portions of the positive and negative power-supply contacts that are respectively pivotally supported at corresponding protrusions of the conductive sheets is less than the width of the second through-holes.

7. The power-supply connector for shelves as claimed in claim 1, wherein the first and second free ends of the positive and negative power-supply contacts are each of circular shape.

8. The power-supply connector for shelves as claimed in claim 6, wherein the positive and negative conductive sheets each comprise a first conductive connecting portion extending in parallel with the longitudinal direction of the first through-hole and second through-hole, wherein each first conductive connecting portion is bent toward a side of the power-supply to form a respective protrusion of the conductive sheets where the middle portions of the positive and negative power-supply contacts are pivotally supported.

9. The power-supply connector for shelves as claimed in claim 4, wherein the bottom cover comprises mounting recesses corresponding to the through-holes, the mounting recesses each comprising a third, a fourth and a fifth recess spaced apart from each other, wherein the first free end, the connecting portion and the second free end of the positive and negative power-supply contact is each guided in the third, fourth and fifth recess, respectively.

10. A power-supply system for shelves having at least one power-supply connector as claimed in claim 1, comprising at least one track, wherein the track is each provided with an upper plate and a lower plate connected with the upper plate, and the lower end surface of the upper plate is provided with a positive and negative conducting bar spaced apart from each other and extending side by side in a longitudinal direction of the track, wherein the track and the at least one power-supply connector are matched such that the at least one power-supply connector can be mounted to the track by inserting a front end of the at least one power-supply connector in a space between the upper and lower plate of the track so that the first free end of the positive power-supply contact and the first free end of the negative power-supply contact is respectively in contact with the positive and negative conductive bar, respectively.

11. The power-supply system for shelves as claimed in claim 10, wherein the second free ends of the positive and negative power-supply contacts abuts against an outer surface of the upper plate of the track causing the first free end of the positive power-supply contact and the first free end of the negative power-supply contact to be pressed in contact with the positive and negative conductive bar, respectively.

* * * * *